United States Patent
Kanamori et al.

(10) Patent No.: US 10,050,005 B2
(45) Date of Patent: Aug. 14, 2018

(54) SEMICONDUCTOR RESIN COMPOSITION, SEMICONDUCTOR RESIN FILM, AND SEMICONDUCTOR DEVICE USING THE SAME

(71) Applicant: TORAY INDUSTRIES, INC., Tokyo (JP)

(72) Inventors: Daisuke Kanamori, Otsu (JP); Takuro Oda, Otsu (JP); Toshihisa Nonaka, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/038,266

(22) PCT Filed: Nov. 25, 2014

(86) PCT No.: PCT/JP2014/081097
§ 371 (c)(1),
(2) Date: May 20, 2016

(87) PCT Pub. No.: WO2015/080098
PCT Pub. Date: Jun. 4, 2015

(65) Prior Publication Data
US 2016/0300810 A1   Oct. 13, 2016

(30) Foreign Application Priority Data

Nov. 27, 2013 (JP) ................. 2013-244675

(51) Int. Cl.
| | | |
|---|---|---|
| C09J 163/00 | (2006.01) | |
| H01L 23/00 | (2006.01) | |
| C08L 21/00 | (2006.01) | |
| H01L 21/683 | (2006.01) | |
| C09D 179/08 | (2006.01) | |
| C08G 73/10 | (2006.01) | |
| C09J 179/08 | (2006.01) | |
| C09J 9/02 | (2006.01) | |
| C09J 7/20 | (2018.01) | |
| C08K 3/36 | (2006.01) | |
| C08L 63/00 | (2006.01) | |

(52) U.S. Cl.
CPC ............ *H01L 24/29* (2013.01); *C08G 73/106* (2013.01); *C08G 73/1017* (2013.01); *C08G 73/1042* (2013.01); *C08G 73/1046* (2013.01); *C08G 73/1064* (2013.01); *C08G 73/1071* (2013.01); *C08G 73/1082* (2013.01); *C08K 3/36* (2013.01); *C08L 21/00* (2013.01); *C08L 63/00* (2013.01); *C09D 179/08* (2013.01); *C09J 7/20* (2018.01); *C09J 9/02* (2013.01); *C09J 163/00* (2013.01); *C09J 179/08* (2013.01); *H01L 21/6836* (2013.01); *C09J 2203/326* (2013.01); *C09J 2205/102* (2013.01); *C09J 2463/00* (2013.01); *C09J 2479/00* (2013.01); *H01L 2221/68327* (2013.01); *H01L 2224/2929* (2013.01)

(58) Field of Classification Search
None
See application file for complete search history.

(56) References Cited

U.S. PATENT DOCUMENTS

| | | | |
|---|---|---|---|
| 2007/0090299 A1 | 4/2007 | Kozakai et al. | |
| 2012/0111621 A1* | 5/2012 | Ohigashi | B32B 15/08 174/258 |
| 2012/0129988 A1 | 5/2012 | Fujimaru et al. | |
| 2014/0118964 A1* | 5/2014 | Nakamura | H05K 3/465 361/748 |
| 2015/0203626 A1* | 7/2015 | Chun | C07D 303/04 523/466 |

FOREIGN PATENT DOCUMENTS

| | | |
|---|---|---|
| JP | 2007-135149 A | 6/2007 |
| JP | 2008-138124 A | 6/2008 |
| JP | 2008-308615 A | 12/2008 |
| JP | 2010-132793 A | 6/2010 |
| JP | 2010-287684 A | 12/2010 |
| JP | 2015-209477 A | 11/2015 |
| SG | 177608 A1 | 2/2012 |
| WO | WO 2010/137442 A1 | 12/2010 |
| WO | WO 2011/004706 A1 | 1/2011 |

OTHER PUBLICATIONS

Written Opinion of the International Searching Authority issued in PCT/JP2014/081097 (PCT/ISA/237), dated Dec. 22, 2014.
Singapore Written Opinion and Search Report issued in Singapore Application No. 11201604018V, dated Jun. 1, 2017.

* cited by examiner

*Primary Examiner* — Jeffrey C Mullis
(74) *Attorney, Agent, or Firm* — Birch, Stewart, Kolasch & Birch, LLP (57) ABSTRACT

The objective of the present invention is to obtain a semiconductor resin composition having a sufficiently low coefficient of linear expansion of the cured product thereof and a uniform distribution of inorganic particles in the direction of film thickness of a produced semi-cured film thereof. The semiconductor resin composition, which contains (a) an epoxy compound, (b) inorganic particles, (c) a polyimide, and (d) a solvent, is characterized by further containing (e) rubber particles and by the fraction of the (b) inorganic particles in the weight of the total solid fraction resulting from subtracting the weight of the (d) solvent from the total weight of the semiconductor resin composition being 60-92 wt % inclusive.

14 Claims, 1 Drawing Sheet

SEMICONDUCTOR RESIN COMPOSITION, SEMICONDUCTOR RESIN FILM, AND SEMICONDUCTOR DEVICE USING THE SAME

TECHNICAL FIELD

The present invention relates to a semiconductor resin composition and a semiconductor resin film which can be used to bond electronic parts or heat dissipation plates used in, for example, personal computers and portable terminals to a printed board or a flexible board, bond boards to each other, and protect a wafer; and a semiconductor device using the semiconductor resin composition or the semiconductor resin film.

More particularly, the present invention relates to a semiconductor resin composition and a semiconductor resin film which are used in bonding or directly electrically connecting a semiconductor chip such as IC or LSI to a circuit board such as a flexible board, a glass epoxy board, a glass board, a ceramic board, or a silicon interposer, bonding semiconductor chips to each other, and in semiconductor chip lamination such as three-dimensional packaging; and a semiconductor device using the semiconductor resin composition or the semiconductor resin film.

BACKGROUND ART

With rapid growth of electronic terminal equipment in recent years, the electronic terminal equipment is downsized, made thinner and becomes high performance. A semiconductor device mounted in the electronic terminal equipment is downsized and densified in association with this, and flip-chip mounting is rapidly spread as a method of mounting a semiconductor chip (hereinafter, may be referred to as a chip) on a circuit board (hereinafter, may be referred to as a board).

In order to enhance reliability of the semiconductor device, an underfill material is filled in a gap between the chip and the board. As a method of filling the underfill material, a method of filling the underfill material in a gap between the chip and the board by use of a capillary phenomenon is common; however, there are problems that an unfilled state easily occurs and production cost is high. As a technique for solving these problems, a technique of forming an underfill material on a wafer and bonding a singulated semiconductor chip to a board is contrived. A method of forming an underfill material on a wafer includes a method of forming a resin composition formed into a film on a wafer through vacuum thermally laminating treatment or the like, and a method of directly applying a resin coating material to form on a wafer.

Although an epoxy resin is commonly used for the underfill material for providing adhesiveness, difference in a coefficient of linear expansion with a chip to be bonded is large if using only an epoxy resin. Therefore, it is difficult to maintain connection reliability when the semiconductor device is subjected to a treatment involving large changes in temperature and requiring higher durability, such as a moisture absorption/reflow treatment and a thermal cycle treatment. Accordingly, inorganic particles may be mixed in large amounts in the underfill material for the purpose of reducing the difference in a coefficient of linear expansion with a chip.

On the other hand, there are a technology of mixing a polyimide for the purpose of imparting heat resistance to the underfill material (refer to Patent Document 1) and a technology of mixing rubber particles for the purpose of relaxing stress exerted on a cured underfill material (refer to Patent Document 2).

PRIOR ART DOCUMENTS

Patent Documents

Patent Document 1: International Publication WO 2011/004706
Patent Document 2: Japanese Patent Laid-open Publication No. 2009-270054

SUMMARY OF THE INVENTION

Problems to be Solved by the Invention

Here, since a fine gap between structures formed on a board or a chip needs to be filled with the underfill material, the inorganic particles mixed in the underfill material also needs to be fine. However, when fine inorganic particles are mixed in large amounts in the underfill material, there has been a problem that a distribution of the inorganic particles is nonuniform in the film thickness direction in forming a film. The reason for this is that when the distribution of the inorganic particles is nonuniform, this causes a thermal stress difference in the film thickness direction, and therefore there is a possibility that connection reliability is deteriorated in connecting between the chips.

On the other hand, in the technology of mixing a polyimide for the purpose of imparting heat resistance to the underfill material (refer to Patent Document 1) and the technology of mixing rubber particles for the purpose of relaxing stress exerted on a cured underfill material (refer to Patent Document 2), there have been concerns that dispersion of the inorganic particles in forming a film is insufficient or a coefficient of linear expansion of the underfill material increases due to mixing of rubber particles. That is, as with the above description, these technologies have had a possibility that connection reliability becomes insufficient in connecting between the chips.

In order to solve the above-mentioned problem, the present invention provides a semiconductor resin composition and a semiconductor resin film which impart heat resistance and in which a coefficient of linear expansion of a cured product is adequately small while relaxing stress and a distribution of the inorganic particles is uniform in the film thickness direction of a semi-cured film formed; and a semiconductor device using these.

Solutions to the Problems

The present invention pertains to a semiconductor resin composition which contains (a) an epoxy compound, (b) inorganic particles, (c) a polyimide, and (d) a solvent, wherein the semiconductor resin composition further contains (e) rubber particles and a ratio of the (b) inorganic particles in the weight of the total solid fraction resulting from subtracting the weight of the (d) solvent from the total weight of the semiconductor resin composition is 60 wt % or more and 92 wt % or less.

Further, the present invention pertains to a semiconductor resin film having, on a support, a semiconductor resin layer containing (a) an epoxy compound, (b) inorganic particles, (c) a polyimide and (e) rubber particles, wherein a ratio of the (b) inorganic particles in the weight of the semiconductor resin layer is 60 wt % or more and 92 wt % or less.

Effects of the Invention

In accordance with the present invention, it is possible to attain a semiconductor resin composition and a semiconductor resin film which impart heat resistance and in which a coefficient of linear expansion of a cured product is adequately small while relaxing stress and a distribution of the inorganic particles is uniform in the film thickness direction of a semi-cured film formed; and a semiconductor device using these.

EMBODIMENTS OF THE INVENTION

The present invention pertains to a semiconductor resin composition which contains (a) an epoxy compound, (b) inorganic particles, (c) a polyimide, and (d) a solvent, wherein the semiconductor resin composition further contains (e) rubber particles and a ratio of the (b) inorganic particles in the weight of the total solid fraction resulting from subtracting the weight of the (d) solvent from the total weight of the semiconductor resin composition is 60 wt % or more and 92 wt % or less.

The semiconductor resin composition of the present invention contains (a) an epoxy compound. The epoxy compound referred to herein refers to a compound containing two or more glycidyl groups or epoxy cyclohexyl groups in a molecule. When the (c) polyimide has a phenolic hydroxyl group, a sulfonic acid group, or a thiol group on its side chain, the (a) epoxy compound reacts with these groups to form a cured product having a higher-density network structure, and therefore the resulting cured semiconductor resin composition exerts more excellent resistance to various chemicals. Therefore, the resistance to various solvents, especially to N-methylpyrrolidone can be increased. Further, since the epoxy compound is generally cured by a ring-opening reaction accompanied by no shrinkage, it becomes possible to reduce the shrinkage of the semiconductor resin composition during curing. As the (a) epoxy compound, an epoxy compound having an epoxy equivalent of 100 or more is preferably used. By setting the epoxy equivalent to 100 or more, the strength of the cured semiconductor resin composition can be increased.

The (a) epoxy compound used in the present invention is not particularly limited as long as it is difunctional or more, and for example, a bisphenol A epoxy resin, a bisphenol F epoxy resin, a bisphenol S epoxy resin, a phenol novolac epoxy resin, a cresol novolac epoxy resin, a biphenyl epoxy resin, a hydroquinone epoxy resin, a diphenylsulfide skeleton-containing epoxy resin, a phenolalkyl polyfunctional epoxy resin, a naphthalene skeleton-containing polyfunctional epoxy resin, a dicyclopentadiene skeleton-containing polyfunctional epoxy resin, a triphenylmethane skeleton-containing polyfunctional epoxy resin, an aminophenol epoxy resin, a diaminodiphenylmethane epoxy resin, and other various polyfunctional epoxy resin can be used.

Examples thereof include jER828, jER1750, jER152, jER1001, jER1002, jER1004AF, jER1007, jER1009, jER1010, YX4000H, jER4004P, jER5050, jER154, jER157S70, jER180S70, YX4000H and YL980 (trade names, manufactured by Mitsubishi Chemical Corporation), TEPIC S, TEPIC G and TEPIC P (trade names, manufactured by NISSAN CHEMICAL INDUSTRIES, LTD.), EPOTOTE YH-434L (trade name, manufactured by Nippon Steel Chemical Co., Ltd.), EPPN 502H, NC3000 and NC3000H (trade names, manufactured by Nippon Kayaku Co., Ltd.), and EPICLON N695, EPICLON HP-7200 and EPICLON HP-4032 (trade names, manufactured by DIC CORPORATION) and the like, but the (a) epoxy compound is not limited to these. These epoxy compounds may be used in combination of two or more thereof.

The (a) epoxy compound preferably contains both of a liquid epoxy compound and a solid epoxy compound. When the liquid epoxy compound is not contained, cracks or chips are likely to be produced in forming a film. When the solid epoxy compound is not contained, the formed film tends to be gooey and becomes hard to handle. A preferred content of the liquid epoxy compound is 10 wt % or more and 50 wt % or less, and more preferably 20 wt % or more and 50 wt % or less in the weight of the (a) epoxy compound. When the content of the liquid epoxy compound is set to this range, cracks, chips or a gooey film in forming a film can be more suppressed.

Herein, the liquid epoxy compound refers to one exhibiting a viscosity of 150 Pa·s or less in an atmosphere of a temperature of 25° C. and a pressure of $1.013 \times 10^5$ N/m$^2$, and the solid epoxy compound refers to one exhibiting a viscosity exceeding 150 Pa·s in an atmosphere of a temperature of 25° C. and a pressure of $1.013 \times 10^5$ N/m$^2$. Examples of the liquid epoxy compound include, in the epoxy compounds described above, JER828, JER1750, JER152, JER630, YL980, and EPICLON HP-4032, but the liquid epoxy compound is not limited to these epoxy compounds.

The semiconductor resin composition of the present invention contains (b) inorganic particles. The (b) inorganic particle can adjust a melt viscosity of the semiconductor resin composition to such an extent that the semiconductor resin composition is not foamed during thermally curing it. As the material of the (b) inorganic particles, silica, alumina, titania, silicon nitride, boron nitride, aluminum nitride, iron oxide, glass, and other metal oxides and metal nitrides, metal carbonates, and metal sulfates such as barium sulfate can be used alone or in combination of two or more thereof. Among these materials, silica can be preferably used in terms of low thermal expansibility, thermal dissipation performance, low moisture absorptivity, and dispersion stability in the semiconductor resin composition.

The (b) inorganic particles may have either a spherical form or a nonspherical form such as a crushed form, a flake form, an elliptical shape, a flattened shape, a rod shape or a fibrous form; however, the (b) inorganic particles having a spherical form can be preferably used because of easy uniform dispersibility in the semiconductor resin composition.

Further, the average particle diameter of the (b) inorganic particles is preferably 10 nm or more and 5 μm or less. More preferably, the average particle diameter is 10 nm or more and 1 μm or less. When the average particle diameter of the (b) inorganic particles is 10 nm or more and 5 μm or less, the particles can be more adequately dispersed in the semiconductor resin composition, and a melt viscosity can be more appropriately adjusted. Further, when the semiconductor resin composition needs to have transparency, the average particle diameter of the (b) inorganic particles is preferably 100 nm or less, and more preferably 60 nm or less. For example, the semiconductor resin composition needs to have transparency for the case where, after a film of the semiconductor resin composition is formed on a board, it is necessary to visually identify marks on the surface of the board through the semiconductor resin composition for the purpose of alignment and the like.

In addition, the average particle diameter of the (b) inorganic particles refers to a particle diameter in the case where the (b) inorganic particles alone are present. When the inorganic particles have a spherical form, the particle diameter refers to its diameter, and when the inorganic particles have a crushed form, a flake form, an elliptical shape or a flattened shape, the particle diameter refers to the maximum length in its shape. Moreover, when the shape is a rod shape or a fibrous form, the particle diameter represents the maximum length in the longitudinal direction. The average particle diameter of the (b) inorganic particles in the semiconductor resin composition can be measured by directly observing the particles with a SEM (scanning electron microscope) and averaging the diameters of 100 particles.

An additive amount of the (b) inorganic particles used in the present invention is 60 wt % or more and 92 wt % or less, and preferably 65 wt % or more and 85 wt % or less with respect to the weight of the total solid fraction resulting from subtracting the weight of the (d) solvent from the total weight of the semiconductor resin composition. When the additive amount is less than 60 wt %, there is a difference in coefficient of linear expansion between the semiconductor resin composition and a chip to be connected, and therefore connection reliability of a semiconductor device prepared by using this semiconductor resin composition is deteriorated. It becomes difficult to maintain connection reliability particularly when the semiconductor device is subjected to a process where higher durability is required such as a moisture absorption/reflow treatment and a thermal cycle treatment. When the additive amount is more than 92 wt %, the following (a) and (b) problems occur.

a: Dispersibility of inorganic particles in the semiconductor resin composition is poor, and the agglomeration of the inorganic particles occurs.

b: When the semiconductor resin composition is formed on a release plastic film to form a semiconductor resin film and the resin film is wound into a roll shape, cracks of the semiconductor resin film are produced or the semiconductor resin composition is exfoliated from the release plastic film.

When the semiconductor resin composition of the present invention is prepared, the (b) inorganic particles may be added in a slurry state in which particles are dispersed in a solvent, or may be added in a powder state without a solvent. Further, both of inorganic particles in a slurry state and inorganic particles in a powder state may be added.

The semiconductor resin composition of the present invention further contains (e) rubber particles. By containing the (e) rubber particles, it is possible to obtain a coating in which the (b) inorganic particles are distributed in an unbiased manner in the film thickness direction in forming the semiconductor resin composition into a film. The rubber particle referred to herein refers to a particle composed of a rubber-like substance having an elastic modulus of $10^6$ to $10^8$ Pa. Examples of a material constituting the (e) rubber particle include a silicone rubber, an isoprene rubber, a butadiene rubber, a styrene-butadiene rubber (SBR), a nitrile rubber (NBR), an acrylic rubber, a methylmethacrylate-styrene-butadiene copolymer (MBS), an acrylonitrile-butadiene-methacrylic acid copolymer, an acrylonitrile-butadiene-acrylic acid copolymer and the like, but the material is not limited to these.

In the present invention, as the (e) rubber particles, any of rubber particles composed of these materials alone and core-shell rubber particles obtained by graft-polymerizing a different type of polymer to the surface of the rubber particles composed of these materials alone can be used. The core-shell rubber particles are preferably used since they can be stably dispersed in the semiconductor resin composition. Also, the core-shell rubber particles are preferred from the viewpoint of handleability or the like. As commercialized products of the rubber particles, FX501P (manufactured by JSR Corp.) which is made of a crosslinked product of a carboxyl-modified butadiene-acrylonitrile copolymer, CX-MN series (manufactured by Nippon Shokubai Co., Ltd.) which is made of acrylic rubber fine particles, YR-500 series (manufactured by NIPPON STEEL CHEMICAL CO., LTD.) and the like, can be used.

As commercialized products of the core-shell rubber particles, for example, "Paraloid (registered trademark)" made of butadiene-alkyl methacrylate-styrene copolymer, EXL-2655 (manufactured by Kureha Chemical Industry Co., Ltd.), "Staphyloid (registered trademark)" made of acrylic acid ester-methacrylic acid ester copolymer, AC-3355, TR-2122 (manufactured by Takeda Chemical Industries, Ltd.), "PARALOID (registered trademark)" made of butyl acrylate-methyl methacrylate copolymer, EXL-2611 and EXL-3387 (manufactured by Rohm & Haas), "Kane Ace (registered trademark)" MX 113 (manufactured by KANEKA CORPORATION) and the like, can be used.

A preferred range of the weight of the (e) rubber particles to be used is 2 to 50 parts by weight, and more preferably 5 to 30 parts by weight with respect to 100 parts by weight of the (a) epoxy compound. When the amount of the (e) rubber particles is within the range of 2 to 50 parts by weight with respect to 100 parts by weight of the (a) epoxy compound, a distribution of the inorganic particles in the film thickness direction in forming the semiconductor resin composition into a film is more uniform, and bonding strength in bonding a chip or the likes is more sufficient.

A preferred range of the weight of the (e) rubber particles to be used is 2 to 100 parts by weight, and more preferably 5 to 50 parts by weight with respect to 100 parts by weight of the liquid epoxy compound. When the amount of the (e) rubber particles is within the range of 2 to 100 parts by weight with respect to 100 parts by weight of the liquid epoxy compound, a distribution of the inorganic particles in the film thickness direction in forming the semiconductor resin composition into a film is more uniform, and bonding strength in bonding a chip or the likes is more sufficient.

In addition, the average particle diameter of the (e) rubber particles refers to a particle diameter in the case where the (e) rubber particles alone are present. The average diameter of the (e) rubber particles in the semiconductor resin composition can be measured by directly observing the particles with a microscope such as TEM (transmission electron microscope) and averaging the diameters of 100 particles. The average particle diameter of the (e) rubber particles used in the present invention is not particularly limited; however, the average particle diameter of 10 nm to 5 m is preferably used. When the average particle diameter of the rubber particle is within this range, it is relatively easy to industrially obtain the rubber particles, and properties of a cured product of the semiconductor resin composition are more uniform.

Further, the average particle diameter of the (e) rubber particles is preferably smaller than or equal to the average particle diameter of the (b) inorganic particles. In this case, the distribution of the (b) inorganic particles in the film thickness direction is more uniform in forming the semiconductor resin composition into a film. Even when the average particle diameter of the (e) rubber particles is larger than the average particle diameter of the (b) inorganic particles, the effect of uniform distribution can be achieved; however, a beneficial effect may be decreased.

The semiconductor resin composition of the present invention contains (c) a polyimide. Since the (c) polyimide has an imide ring, it is excellent in heat resistance and chemical resistance. In particular, use of a polyimide having on its side chain at least one functional group reactive with an epoxy group promotes the ring opening and addition reaction to the aromatic polyimide of an epoxy compound during heating treatment to enable to attain a composition having a network structure of even higher density. Examples of the functional group reactive with an epoxy group include a phenolic hydroxyl group, a sulfonic acid group, and a thiol group.

Examples of the method of synthesizing such a (c) polyimide include, but are not limited to, a method in which an acid dianhydride having a group reactive with an epoxy group and a diamine are first reacted to synthesize a polyimide precursor, and the polyimide precursor is end-modified using a primary monoamine as an end-capping agent, and subsequently subjected to heat treatment at 150° C. or higher to cause polyimide cyclization. Other methods include a method in which an acid dianhydride is reacted in advance with a primary monoamine, an end-capping agent; a diamine is added to synthesize an end-modified polyimide precursor; and polyimide cyclization of the end-modified polyimide precursor is further performed at a high temperature of 150° C. or higher.

A preferred example of the (c) polyimide used in the present invention has a structure represented by any of a general formula (2) or a general formula (3). The example has at least one functional group reactive with an epoxy group on its side chain. Further, the preferred example has a structure represented by a general formula (1) as $R^4$ in the general formula (2) and the general formula (3). The amount of the structure represented by the general formula (1) is 5 wt % or more and 15 wt % or less with respect to the total amount of the (c) polyimide. By setting the amount to 5 wt % or more, it is possible to impart more moderate flexibility to a rigid polyimide, and by setting the amount to 15 wt % or less, it is possible to maintain rigidity of a polyimide skeleton and to keep heat resistance and insulating properties more.

In the above-mentioned method of synthesizing (c) a polyimide, the detail will be described later, but the structure represented by the general formula (1) is included as $R^4$ in the general formulae (2) and (3), and is therefore a constituent of a diamine.

In addition, herein, the total amount of the (c) polyimide refers to the weight of a polymer (polyimide) obtained by polymerization of constituents including a diamine, an acid dianhydride and an end-capping agent, and the weight of a polyimide does not include a diamine, an acid dianhydride and an end-capping agent which are respectively excessively charged in synthesizing a polyimide.

[Chem. 1]

in which $R^1$ is a divalent hydrocarbon group, $R^2$ is a monovalent hydrocarbon group, and n represents an integer of 1 to 10.

In the above formula, $R^1$ is a divalent hydrocarbon group. $R^1$ is preferably an alkylene group having 1 to 5 carbon atoms or a phenylene group. $R^2$ is a monovalent hydrocarbon group. $R^2$ is preferably an alkyl group having 1 to 5 carbon atoms or a phenyl group. The (c) polyimide may be a polyimide containing one type of $R^1$ and one type of $R^2$, or may be a polyimide containing plural types of $R^1$s and/or plural types of $R^2$s. Further, the (c) polyimide may be formed by mixing plural types of polyimides containing $R^1$s having different structures and/or $R^2$s having different structures. Further, in the polyimide containing plural types of $R^1$s and/or plural types of $R^2$s, plural types of polyimides having different ratios between plural types of R's and/or between plural types of $R^2$s may be mixed.

Further, as described above, the amount of the structure represented by the general formula (1) is 5 wt % or more and 15 wt % or less with respect to the total amount of the (c) polyimide. However, for example, when plural types of polyimides are mixed, the amount of the structure represented by the general formula (1) does not have to be 5 wt % or more and 15 wt % or less with respect to the total amount of a polyimide in all of the polyimides. A sum of the structures represented by the general formula (1) which the polyimides include only have to be 5 wt % or more and 15 wt % or less of the sum of the total amount of the polyimide.

n represents an integer of 1 to 10, and is preferably 1 to 2. By setting n to 1 or more, it is possible to suppress the shrinkage of the semiconductor resin composition during curing, and by setting n to 10 or less, it is possible to improve insulating properties and heat resistance of the semiconductor resin composition without reducing an imide-group content in the polyimide skeleton.

[Chem. 2]

in which $R^3$ is a tetra- to 14-valent organic group, $R^4$ is a di- to 12-valent organic group, at least one of $R^3$ and $R^4$ contains at least one group selected from the group consisting of a 1,1,1,3,3,3-hexafluoropropyl group, an isopropyl group, an ether group, a thioether group and a $SO_2$ group, $R^5$ and $R^6$ each represent an organic group having at least one group selected from the group consisting of a phenolic hydroxyl group, a sulfonic acid group and a thiol group, X represents a monovalent organic group, m is 8 to 200, α and β each represent an integer of 0 to 10 and α+β is an integer of 0 to 10, and a ratio of the structural units in which α+β is an integer of 1 to 10 in the structural units whose repeating number is m, is 20 to 90 mol %.

In the above formula, $R^3$ is a tetra- to 14-valent organic group, $R^4$ is a di- to 12-valent organic group, and at least one of $R^3$ and $R^4$ contains at least one group selected from the group consisting of a 1,1,1,3,3,3-hexafluoropropyl group, an isopropyl group, an ether group, a thioether group and a $SO_2$ group (hereinafter, the group selected from this group is referred to as "specific group"). Further, $R^3$ and $R^4$ preferably contain an aromatic group. $R^5$ and $R^6$ each represent an organic group having at least one group selected from the group consisting of a phenolic hydroxyl group, a sulfonic acid group and a thiol group.

The (c) polyimide may be a polyimide containing one type of $R^3$ and one type of $R^4$ and one type of $R^5$ and one type of $R^6$, or may be a polyimide containing plural types of $R^3$s and/or plural types of $R^4$s and/or plural types of $R^5$s and/or plural types of $R^6$s. Further, the (c) polyimide may be formed by mixing plural types of polyimides containing $R^3$s having different structures and/or $R^4$s having different structures and/or $R^5$s having different structures and/or $R^6$s having different structures. Further, in the polyimide containing plural types of $R^3$s and/or plural types of $R^4$s and/or plural types of $R^5$s and/or plural types of $R^6$s, plural types of polyimides having different ratios between plural types of $R^3$s and/or between plural types of $R^4$s and/or between plural types of $R^5$s and/or between plural types of $R^6$s, may be mixed.

X represents a monovalent organic group. m is 8 to 200. α and β each represent an integer of 0 to 10 and α+β is an integer of 0 to 10. However, a ratio of the structural units in which α+β is an integer of 1 to 10 in the structural units whose repeating number is m, is 20 to 90 mol %.

In addition, the (c) polyimide used in the present invention is preferably organic solvent-soluble. Even a polyimide which is not organic solvent-soluble can be used by being dispersed in the (d) solvent, but if doing so, sometimes a uniform semiconductor resin layer cannot be formed. Being organic solvent-soluble referred to herein means being soluble in an amount of 20 wt % or more at 23° C. in at least one solvent selected from the following:
Ketone-based solvents such as acetone, methyl ethyl ketone, methyl isobutyl ketone, cyclopentanone and cyclohexanone.
Ether-based solvents such as 1,4-dioxane, tetrahydrofuran and diglyme.
Glycol ether-based solvents such as methyl cellosolve, ethyl cellosolve, propylene glycol monomethyl ether, propylene glycol monoethyl ether, propylene glycol monobutyl ether and diethylene glycol methyl ethyl ether.
Other solvents such as benzyl alcohol, N-methylpyrrolidone, γ-butyrolactone, ethyl acetate and N,N-dimethylformamide.

In the general formulae (2) and (3), $R^3$ represents a structural component of an acid dianhydride, and particularly, $R^3$ is preferably a tetra- to 14-valent organic group having 5 to 40 carbon atoms. $R^4$ represents a structural component of a diamine, and particularly, $R^4$ is preferably a di- to 12-valent organic group having 5 to 40 carbon atoms. Both of $R^3$ and $R^4$ preferably contain at least one of the specific groups.

$R^5$ is a substituent of the acid dianhydride, and preferably a group selected from the group consisting of a phenolic hydroxyl group, a sulfonic acid group and a thiol group. $R^6$ is a substituent of the diamine, and preferably a group selected from the group consisting of a phenolic hydroxyl group, a sulfonic acid group and a thiol group.

Acid dianhydrides to be used will be described. Specific examples of the acid dianhydride having at least one of the specific groups include 2,2-bis(3,4-dicarboxyphenyl)propane dianhydride, 2,2-bis(2,3-dicarboxyphenyl) propane dianhydride, bis(3,4-dicarboxyphenyl)sulfone dianhydride, bis(3,4-dicarboxyphenyl)ether dianhydride, 2,2-bis(3,4-dicarboxyphenyl) hexafluoropropane dianhydride, and derivatives thereof each having an alkyl substituent or a halogen substituent on its aromatic ring.

Specific examples of the acid dianhydride having at least one of the specific groups and at least one group selected from the group consisting of a phenolic hydroxyl group, a sulfonic acid group, and a thiol group include aromatic acid dianhydrides having a structure described below.

[Chem. 3]

In the above formula, $R^9$ represents $C(CF_3)_2$, $C(CH_3)_2$, $SO_2$, S or O. $R^{10}$ and $R^{11}$ are each a hydrogen atom, a hydroxyl group, a thiol group or a sulfonic acid group. However, $R^{10}$ and $R^{11}$ are not a hydrogen atom at the same time.

Specific examples of the acid dianhydride not having the specific group and having at least one group selected from the group consisting of a phenolic hydroxyl group, a sulfonic acid group and a thiol group include aromatic acid dianhydrides having a structure described below.

[Chem. 4]

$R^7$ and $R^8$ are each a hydrogen atom, a hydroxyl group, a thiol group or a sulfonic acid group. However, $R^1$ and $R^8$ are not a hydrogen atom at the same time.

Specific examples of the acid dianhydride having neither a specific group nor a phenolic hydroxyl group, a sulfonic acid group and a thiol group include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 1,1-bis(3,4-dicarboxyphenyl)ethane dianhydride, 1,1-bis(2,3- dicarboxyphenyl)ethane dianhydride, bis(3,4-dicarboxyphenyl)methane dianhydride, bis(2,3-dicarboxyphenyl)methane dianhydride, 1,2,5,6-naphthalenetetracarboxylic dianhydride, 2,3,6,7-naphthalenetetracarboxylic dianhydride, 2,3,5,6-pyridinetetracarboxylic dianhydride and 3,4,9,10-perylenetetracarboxylic dianhydride, and derivatives thereof each having an alkyl substituent or a halogen substituent on its aromatic ring.

In the present invention, these acid dianhydrides are used alone or in combination of two or more.

Diamines that can be used will be described. Specific examples of the diamine having at least one of the specific groups described above include 3,4'-diaminodiphenylsulfide, 4,4'-diaminodiphenylsulfide, 3,4'-diaminodiphenyl ether, 4,4'-diaminodiphenyl ether, 3,4'-diaminodiphenylsulfone, 4,4'-diaminodiphenylsulfone, bis(4-aminophenoxyphenyl)sulfone, bis(3-aminophenoxyphenyl)sulfone, bis(4-aminophenoxy)biphenyl, bis[4-(4-aminophenoxy)phenyl] ether, 1,4-bis(4-aminophenoxy)benzene, 1,3-bis(4-aminophenoxy)benzene, 2,2-bis[4-(4-aminophenoxy)phenyl]hexafluoropropane, 2,2-bis[4-(4-aminophenoxy)phenyl]propane, and derivatives thereof each having an alkyl substituent or a halogen substituent on its aromatic ring.

Specific examples of the diamine having at least one of the specific groups and at least one group selected from the group consisting of a phenolic hydroxyl group, a sulfonic acid group, and a thiol group include 2,2-bis(3-amino-4-hydroxyphenyl)hexafluoropropane, 2,2-bis(3-hydroxy-4-aminophenyl)hexafluoropropane, 2,2-bis(3-amino-4-hydroxyphenyl)propane, 2,2-bis(3-hydroxy-4-aminophenyl)propane, 3,3'-diamino-4,4'-dihydroxydiphenyl ether, 3,3'-diamino-4,4'-dihydroxydiphenylsulfone, 3,3'-diamino-4,4'-dihydroxydiphenylsulfide, derivatives thereof each having an alkyl substituent or a halogen substituent on its aromatic ring, and diamines having one of structures described below.

[Chem. 5]

In the above formula, $R^{16}$ represents $C(CF_3)_2$, $C(CH_3)_2$, $SO_2$, S or O. $R^{17}$ and $R^{18}$ are each a hydrogen atom, a hydroxyl group, a thiol group, or a sulfonic acid group. However, $R^{17}$ and $R^{18}$ are not a hydrogen atom at the same time.

Specific examples of the diamine having no specific group but having at least one group selected from the group consisting of a phenolic hydroxyl group, a sulfonic acid group, and a thiol group include 3,3'-diamino-4,4'-dihydroxybiphenyl, 2,4-diaminophenol, 2,5-diaminophenol, 1,4-diamino-2,5-dihydroxybenzene, diaminodihydroxypyrimidine, diaminodihydroxypyridine, hydroxydiaminopyrimidine, 9,9-bis(3-amino-4-hydroxyphenyl)fluorene, derivatives thereof each having an alkyl substituent or a halogen substituent on its aromatic ring, and diamines having one of structures described below.

[Chem. 6]

In the above formula, $R^{12}$ to $R^{15}$ are each a hydrogen atom, a hydroxyl group, a thiol group, or a sulfonic acid group. However, $R^{12}$ and $R^{13}$ are not a hydrogen atom at the same time.

Specific examples of the diamine not having the specific group and not having a phenolic hydroxyl group, a sulfonic acid group or a thiol group include 3,4'-diaminodiphenylmethane, 4,4'-diaminodiphenylmethane, benzidine, m-phenylenediamine, p-phenylenediamine, 1,5-naphthalenediamine, 2,6-naphthalenediamine, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, derivatives thereof each having an alkyl substituent or a halogen substituent on its aromatic ring; and terephthalic acid hydrazide, isophthalic acid hydrazide, phthalic acid hydrazide, 2,6-naphthalenedicarboxylic acid dihydrazide, 4,4'-bisphenyl dicarbonohydrazine, 4,4'-cyclohexane dicarbonohydrazine, and hydrazide derivatives thereof each having an alkyl substituent or a halogen substituent on its aromatic ring. The diamines used in the present invention are used alone or in combination of two or more.

Further, the structure represented by the general formula (1) is included as $R^4$ in the general formulae (2) and (3), and is therefore a constituent of a diamine. Examples of the diamine containing the structure represented by the general formula (1) include bis(3-aminopropyl) tetramethyldisiloxane, bis(p-amino-phenyl)octamethylpentasiloxane and the like.

The rate of the reaction between the polyimide and the epoxy compound during heat treatment can be adjusted by selecting $R^5$ and $R^6$ in the general formulae (2) and (3), and thereby, the cross-linking density of the semiconductor resin composition can be adjusted. This makes it possible to impart necessary heat resistance and chemical resistance to the semiconductor resin composition. $\alpha$ and $\beta$ each represent an integer of 0 to 10 and $\alpha+\beta$ is an integer of 0 to 10. However, a ratio of the structural units in which $\alpha+\beta$ is an integer of 1 to 10 in the structural units whose repeating number is m, is 20 to 90 mol %. Further, 20 to 90% of the total of $R^5$s and $R^6$s are preferably phenolic hydroxyl groups, sulfonic acid groups, or thiol groups. By setting the ratio of these groups to the total of $R^5$s and $R^6$s to 20% or more, it is possible to more improve the chemical resistance and heat resistance, and by setting the ratio to 90% or less, it is possible to keep the cross-linking density within an appropriate range to more maintain the elongation and toughness of the film.

X, a structural component of the general formulae (2) and (3), is a component derived from a primary monoamine, an end-capping agent. These monoamines may be used singly or in a combination with other end-capping groups. Specific examples of the primary monoamines include 5-aminoquinoline, 4-aminoquinoline, 3-aminonaphthalene, 2-aminonaphthalene, 1-aminonaphthalene, aniline and the like. Of these, aniline is preferably used.

A primary monoamine, not having another substituent which reacts with the epoxy compound, is preferably used. This makes it possible to obtain an organic-solvent-soluble polyimide not having a substituent which reacts with the epoxy compound, at the end of the polyimide having high molecular mobility. The use of such an organic-solvent-soluble polyimide makes it possible to suppress the progress of the reaction between the organic-solvent-soluble polyimide and the epoxy compound at room temperature to further enhance the storage life of the semiconductor resin composition.

The ratio of the X component in the general formulae (2) and (3) to be introduced is preferably 0.1 to 60 mol %, and particularly preferably 5 to 50 mol % with respect to the total amount of diamine components on the primary monoamine component equivalent basis, the primary monoamine component as an end-capping agent being an X's original component.

In the general formulae (2) and (3), m represents the repeating number of the polymer and a range of 8 or more and 200 or less. m is preferably 10 to 150. A weight average molecular weight of the polyimide is preferably 4000 to 80000, and particularly preferably 8000 to 60000 on the polystyrene equivalent basis by gel filtration chromatography. By setting m to 8 or more, it is possible to increase the viscosity to enable a thick coating, and by setting m to 200 or less, it is possible to improve the solubility of the polyimide in a solvent. Here, the weight average molecular weight of the (c) polyimide can be determined by the following method. A polyimide solution having a solid concentration of 0.1% by mass prepared by dissolving the soluble polyimide in N-methylpyrrolidone (NMP) is used, and a weight average molecular weight on the polystyrene equivalent basis is calculated using a GPC apparatus Waters 2690 (manufactured by Waters Corporation). GPC measurement is performed by using NMP containing 0.05 mol/L of LiCl and 0.05 mol/L of phosphoric acid dissolved therein as a mobile phase at a developing speed of 0.4 mL/min.

A GPC measurement system used includes, for example, the following.
Detector: Waters 996
System controller: Waters 2690
Column oven: Waters HTR-B
Thermo controller: Waters TCM
Columns: TOSOH grard comn
Columns: TOSOH TSK-GEL $\alpha$-4000
Columns: TOSOH TSK-GEL $\alpha$-2500

The (c) polyimide to be used in the present invention may be only a polyimide composed of structures represented by the general formulae (2) and (3), may be a copolymer having another structure as a copolymerization component in structures represented by the general formulae (2) and (3), or may be a mixture thereof. Furthermore, in any one of these polyimides, a polyimide represented by another structure may be mixed. In this case, the polyimide preferably contains structures represented by the general formulae (2) and (3) in an amount of 50 mol % or more. The type and amount of structure used for copolymerization or mixing are preferably selected without impairing the heat resistance of a heat resistant resin coating obtained by heat treatment.

The structure of the general formula (1) and the end-capping agent used in the present invention introduced into the polymer can be easily detected and quantitatively determined by the following method. For example, the polymer into which the structure of the general formula (1) and the end-capping agent are introduced is dissolved in an acidic solution or a basic solution and decomposed into polymer constituents, diamine components and acid anhydride components, and these components are subjected to a measurement using gas chromatography (GC) or NMR, and thereby, the structure of the general formula (1) and the end-capping agent used can be easily detected and quantitatively determined. Alternatively, the structure of the general formula (1) and the end-capping agent used can also be easily detected and quantitatively determined by directly subjecting the polyimide into which the end-capping agent is introduced to measurement using pyrolysis gas chromatography (PGC), or using infrared spectra and 13C-NMR.

The content of the (c) polyimide is preferably 15 to 90 parts by weight with respect to 100 parts by weight of the (a) epoxy compound, and is more preferably 30 to 70 parts by weight in order to form a high-density network structure by the reaction with the epoxy compound. When the content of the (c) polyimide is 15 parts by weight or more, heat resistance is more improved. When the content of the (c) polyimide is 90 parts by weight or less, the adhesive composition becomes lower in water absorption, and therefore foaming in curing the adhesive composition by heating can be more suppressed, and for example, a reduction of the adhesive force between a circuit board and a semiconductor chip is more reduced, and connection reliability is more improved.

While the organic solvent-soluble polyimide is suitably used as the (c) polyimide, polymers having an amide bond, such as polyurethane, polyamide and polyamide-imide, are not preferred since they are lower in heat resistance and higher in water absorption than organic solvent-soluble polyimide and therefore they become a factor reducing connection reliability.

The present invention is a semiconductor resin composition further containing (d) a solvent. Examples of the (d) solvent capable of being used in the present invention include ethers such as ethylene glycol monomethyl ether, ethylene glycol monoethyl ether, propylene glycol monomethyl ether, propylene glycol monoethyl ether, ethylene glycol dimethyl ether, ethylene glycol diethyl ether, ethylene glycol dibutyl ether, diethylene glycol monomethyl ether, diethylene glycol monoethyl ether (ethyldiglycol) and diethylene glycol monobutyl ether; acetates such as ethylene glycol monoethyl ether acetate, propylene glycol monomethyl ether acetate (PGMEA), diethylene glycol monomethyl ether acetate, propyl acetate, butylacetate, isobutylacetate, 3-methoxybutyl acetate, 3-methyl-3-methoxybutyl acetate, methyl lactate, ethyl lactate and butyl lactate; ketones such as acetone, methyl ethyl ketone, acetylacetone, methyl propyl ketone, methyl butyl ketone, methyl isobutyl ketone, cyclopentanone and 2-heptanone; alcohols such as butyl alcohol, isobutyl alcohol, pentanol, 4-methyl-2-pentanol, 3-methyl-2-butanol, 3-methyl-3-methoxybutanol and diacetone alcohol; aromatic hydrocarbons such as toluene and xylene; N-methyl-2-pyrrolidone, N-cyclohexyl-2-pyrrolidone, N,N-dimethylformamide, N,N-dimethylacetamide, dimethylsulfoxide and γ-butyrolactone and the like.

Among these solvents, solvents in which the (c) polyimide is dissolved and which has a boiling point of 100° C. to 220° C. at atmospheric pressure are particularly preferred. When the boiling point is in this range, it does not happen that when applying the semiconductor resin composition, the solvent excessively volatilizes to fail in application of the semiconductor resin composition, and since a drying/heat treatment temperature of the semiconductor resin composition does not need to be elevated, a material of the board or support film is not subjected to constraints. Further, by using the solvent in which the (c) polyimide is dissolved, a highly uniform coating can be formed on the board or the support film. Herein, the boiling point referred to in the present invention is a boiling point at 1 atmospheric pressure, that is, a pressure of $1.013 \times 10^5$ N/m². The boiling point can be measured using a publicly known technology, and it is not particularly limited, and can be measured, for example, by using a boiling point meter of Swietoslawski.

Specific examples of particularly preferred organic solvent having such a boiling point include cyclopentanone, ethylene glycol monomethyl ether, ethylene glycol monoethyl ether, propylene glycol monomethyl ether, diethylene glycol monomethyl ether, diethylene glycol monoethyl ether, propylene glycol monomethyl ether acetate, methyl lactate, ethyl lactate, diacetone alcohol and 3-methyl-3-methoxybutanol and the like.

A preferred range of the weight of the (d) solvent contained in the semiconductor resin composition of the present invention is 10 to 50 wt % in the total weight of the semiconductor resin composition, and more preferably 20 to 40 wt %. When the weight of the (d) solvent is 10 to 50 wt % in the total weight of the semiconductor resin composition, the (a) epoxy compound and the (c) polyimide can be more adequately dissolved in the (d) solvent, and a sufficient film thickness can be achieved in forming a film.

The semiconductor resin composition of the present invention preferably further contains (f) an epoxy curing agent. By containing the (f) epoxy curing agent, it becomes possible to cure the composition in a short time. As the (f) epoxy curing agent, an imidazole-based curing agent is preferred from the viewpoint of reactivity and storage stability. Examples of one preferably used as the (f) epoxy curing agent include 2PZ, 2P4MZ, 2E4MZ, 2MA-OK, C11Z (trade name, manufactured by SHIKOKU CHEMICALS CORPORATION) and the like, but it is not limited to these. On the other hand, epoxy curing agents referred to as a microcapsule-type curing agent, such as NOVACURE HX-3941HP, NOVACURE HXA3922HP, NOVACURE HXA3932HP, and NOVACURE HXA3042HP (trade names, manufactured by ASAHI KASEI E-MATERIALS CORPORATION) and the like, are excellent in reactivity, but when they are used for a coating material including an organic solvent, they are low in storage stability and viscosity is increased, and therefore they are not preferred.

The content of the (f) epoxy curing agent is preferably 0.1 part by weight or more and 20 parts by weight or less with respect to 100 parts by weight of the (a) epoxy compound. When the content of the (f) epoxy curing agent is set to this range, the semiconductor resin composition of the present invention can be stored at room temperature for an extended period of time, and the semiconductor resin composition can be adequately cured.

The semiconductor resin composition of the present invention may contain a surfactant for the purpose of improving compatibility with the board. Such a surfactant is not particularly limited, and examples thereof include a fluorine-based surfactant, a silicon-based surfactant, a nonionic surfactant and the like.

Specific examples of the fluorine-based surfactants (hereinafter, trade name) include Megafac F171, F173, R-30 (manufactured by DIC Corporation (the former Dainippon Ink and Chemicals, Inc.)), Fluorad FC-430, FC-431 (manufactured by Sumitomo 3M Ltd.), Asahi Guard AG710, Surflon S-382, SC-101, SC-102, SC-103, SC-104, SC-105, and SC-106 (manufactured by Asahi Glass Co., Ltd.), and specific examples of the silicon-based surfactants include BYK-313, BYK-333, BYK-337, BYK-378 and BYK-A506 (manufactured by BYK-Chemie Japan), but the surfactant is not limited to these surfactants. These surfactants may be used singly, or may be used in combination of two or more types thereof.

The semiconductor resin composition of the present invention may contain (g) an adhesion promoter for the purpose of improving adhesiveness to the board. In doing so, plural types of the (g) adhesion promoters may be used in combination. Examples of such (g) adhesion promoters include chlorosilanes such as trimethylchlorosilane, dimethylvinylchlorosilane, methyldiphenylchlorosilane and chloromethyldimethylchlorosilane; alkoxysilanes such as trimethylmethoxysilane, dimethyldimethoxysilane, dimethyldiethoxysilane, dimethylvinylethoxysilane, diphenyldimethoxysilane and phenyltriethoxysilane; silazanes such as hexamethyldisilazane, N,N'-bis(trimethylsilyl)urea, dimethyltrimethylsilylamine and trimethylsilylimidazole; silanes such as vinyltrichlorosilane, γ-chloropropyltrimethoxysilane, γ-aminopropyltriethoxysilane, γ-methacryloxypropyltrimethoxysilane, γ-glycidoxypropyltrimethoxysilane and γ-(N-piperidinyl)propyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole and mercaptopyrimidine; and ureas such as 1, 1-dimethylurea and 1,3-dimethylurea, and thiourea compounds. Further, polymer-based adhesion improvers such as BYK-4509, BYK-4512 and BYK-4510 (manufactured by BYK-Chemie Japan) may be used.

A semiconductor resin composition obtained by mixing and dissolving the above-mentioned materials may be filtered using a filter paper or a filter. A method of filtering is not particularly limited; however, in order to pass the (b) inorganic particles dispersed, a filtration method is preferred in which the semiconductor resin composition is filtered by pressurized filtration using a filter with a retained particle diameter of 10 μm or more.

Identification of the semiconductor resin composition of the present invention and check of compounded amounts of the components can be performed by the following methods. The semiconductor resin composition is subjected to HPLC measurement based on various eluent composition, and GPC measurement to check the number of components compounded in the semiconductor resin composition.

A solvent is removed by a rotary evaporator or precision distillation with careful attention not to modify each component. Thereafter, the components are (isolated) refined by techniques such as preparative HPLC, preparative GPC and column chromatography based on various eluents. The components can also be (isolated) refined without removing the solvent by techniques such as preparative HPLC, preparative GPC and column chromatography based on various eluents. Identification of a solvent type can be performed by techniques such as GC-MASS, $^1$HNMR, $^{13}$CNMR, and various two-dimensional NMR of HMBC, HMQC and the like. When a plurality of high molecular weight components are contained in the semiconductor resin composition, these components can also be refined by selecting good solvents and poor solvents, and performing reprecipitation utilizing a difference in solubility between high molecular weight components.

With respect to high molecular weight component, it is possible to determine whether the high molecular weight component contains the (c) polyimide by techniques such as $^1$HNMR, $^{13}$CNMR, various two-dimensional NMR of HMBC, HMQC and the like, and IR measurement. Next, the solubility of the refined polyimide is checked, and thereby it is possible to determine whether the (c) polyimide is an organic solvent-soluble polyimide or not. The (a) epoxy compound, the (d) solvent and the (f) epoxy curing agent which are other components can be identified by techniques such as check of a parent peak and analysis of fragment in mass spectrometry of each component isolated and refined, $^1$HNMR, $^{13}$CNMR, DEPT measurement, and various two-dimensional NMR of HMBC, HMQC and the like.

With respect to inorganic particles, the semiconductor resin composition is diluted with a solvent contained in the semiconductor resin composition, and then a particle diameter of the inorganic particle is measured. Thereafter, the semiconductor resin composition is filtered using a filter having a pore size by which a particle with a minimum size can be captured to recover inorganic particles. Particle diameters of the recovered inorganic particles are measured again to confirm that the inorganic particles can be completely recovered. Then, elemental analysis of the recovered inorganic particles is performed, and thereby composition of the inorganic particles can be checked.

The rubber particles can be identified by recovering the rubber particles from a filtrate after recovering the inorganic particles and performing analyses such as IR, TOF-SIMS and elemental analysis. The rubber particles can be recovered from the filtrate through filtration using a filter having a pore size by which the rubber particles can be captured or separation by an ultracentrifuge.

Next, a method of checking the compounded amount of each component will be described. The compounded amount of each component can be checked, for example, by isolating 100 g of the semiconductor resin composition into each component, and weighing a weight of each component. Also, the compounded amount can be determined by using internal standard substances such as biphenyl and isolated/refined products, and performing the preparation of a calibration curve and quantitative determination of each component using HPLC and GC. By these techniques, ratios of the compounded amounts of the (c) polyimide and the (a) epoxy compound, the (f) epoxy curing agent, and the (b) inorganic particles can be checked.

Next, a method of identifying the ratio of the (b) inorganic particles in the weight of the total solid fraction resulting from subtracting the weight of the (d) solvent from the total weight of the semiconductor resin composition will be described. At first, thermogravimetric analysis of the semiconductor resin composition is performed under a stream of nitrogen, and thereby it is possible to know the weight of the total solid fraction resulting from subtracting the weight of the (d) solvent from the total weight of the semiconductor resin composition. That is, a residue after the thermogravimetric analysis under a stream of nitrogen corresponds to the (B) total solid fraction, and a weight difference between the (B) total solid fraction and a sample used in the (A) analysis corresponds to the weight of the (d) solvent. That is, when the (a) epoxy compound includes a liquid epoxy compound, the liquid epoxy compound is also considered as a solid fraction.

As the conditions of the thermogravimetric analysis, a temperature and time to adequately volatilize the solvent only has to be ensured. For example, when about 10 mg of a semiconductor resin composition using PGMEA as the solvent is used for thermogravimetric analysis, a temperature of the semiconductor resin composition is raised to 250° C. at a temperature raising rate of 10° C./min and maintained at 250° C. for 30 minutes, etc. Furthermore, by subjecting the (B) total solid fraction to the thermogravimetric analysis under a stream of air (or oxygen-containing vapor), a weight ratio of the (b) inorganic particles in the (B) total solid fraction can be known. That is, a weight of (C) a residue after the thermogravimetric analysis under a stream of air is the weight of the (b) inorganic particles, and from a weight ratio of the (C) to the (B) total solid fraction, a ratio of the (b) inorganic particles can be known. As the conditions of the thermogravimetric analysis under a stream of air, a temperature and time to adequately burn nonvolatile organic components in the semiconductor resin composition only have to be ensured. For example, a temperature of the semiconductor resin composition is raised to 550° C. at a temperature raising rate of 10° C./min and maintained at 550° C. for 60 minutes, etc. For the thermogravimetric analysis, a thermogravimetry differential thermal analyzer (TG/DTA6200, manufactured by SII Nanotechnology Corporation) can be used.

Next, identification of a monomer unit structure of polyimide can be performed by the following method. Polyimide is dissolved in an acid solution to be decomposed into an amine component and a carboxylic acid anhydride component which are constituent units of the polyimide, and then the components are isolated and refined by techniques such as preparative HPLC, preparative GPC and column chromatography based on various eluents. Each component can be identified by techniques such as $^1$HNMR, $^{13}$CNMR, DEPT measurement and various two-dimensional NMR of HMBC, HMQC and the like.

The semiconductor resin composition of the present invention can be suitably used as semiconductor resin adhesives and coating materials for bonding, fixing or sealing a semiconductor element, a semiconductor device, a circuit board or metal wiring materials.

The semiconductor resin film of the present invention is a semiconductor resin film having, on a support, a semiconductor resin layer containing (a) an epoxy compound, (b) inorganic particles, and (c) a polyimide, wherein a ratio of the (b) inorganic particles in the weight of the semiconductor resin layer is 60 wt % or more and 92 wt % or less, and the semiconductor resin layer further contains (e) rubber particles. The components of (a) to (c) and (e) are similar to the above description. A material of the support is not particularly limited and can be employed as long as it is not dissolved in the (d) solvent contained in the semiconductor resin composition. Preferred examples of the material of the support include a resin, copper, stainless steel, and aluminum; however, the material of the support is not limited to these materials. A shape of the support is not particularly limited; however, a support having a flat plane such as a film shape and a plate shape is preferred. A material most suitably used as the support is a film made of a resin (hereinafter, referred to as a support film).

Next, a method for producing a semiconductor resin film using the semiconductor resin composition of the present invention will be described. The semiconductor resin film of the present invention is obtained by applying the above-mentioned semiconductor resin composition onto a support, and drying the composition to form a semiconductor resin layer on the support.

In the method for producing a semiconductor resin film of the present invention, it is most preferred that the semiconductor resin layer is formed on a support film serving as a support. Support film used in this case is not particularly limited, and various films usually commercially available, such as polyethylene terephthalate (PET) films, polyphenylene sulfide films and polyimide films, can be used. Bonding plane between the support film and the semiconductor resin layer may be surface treated with silicone, a silane coupling agent, an aluminum chelate agent or the like for the purpose of improving adhesiveness and releasability. Further, a thickness of the support film is not particularly limited; however, it is preferably in the range of 10 to 75 μm.

In the method for producing a semiconductor resin film of the present invention, a protective film may be formed onto the semiconductor resin layer for protecting the semiconductor resin layer. Thereby, a surface of the semiconductor resin layer of the semiconductor resin film can be protected from contaminants such as debris and dusts in the atmosphere.

Examples of the protective film include polyethylene films, polypropylene (PP) films, and polyester films and the like. The protective film preferably has small adhesive power to the semiconductor resin layer.

Examples of a method of applying the semiconductor resin composition of the present invention onto a support film include methods such as spray coating, roll coating, screen printing, a blade coater, a die coater, a calender coater, a meniscus coater, a bar coater, a roll coater, a comma roll coater, a gravure coater, a screen coater and a slit die coater and the like. Further, an applied film thickness varies depending on the coating technique, the solid content of the resin composition, the viscosity and the like; however it is preferred that the dried film thickness is usually not less than 0.5 μm and not more than 100 μm.

For drying, an oven, a hot plate, infrared rays or the like may be used. The drying temperature and the drying time need only to be in a range where the solvent can be volatilized and it is preferred to appropriately set such a range in which the semiconductor resin film is in a state of being uncured or semi-cured. Specifically, drying is preferably carried out in the range of 40 to 120° C. for 1 minute to several tens of minutes. Further, drying (heat treatment) may be carried out at various temperatures increasing in phases, for example, at 50° C., at 60° C., and then at 70° C. for 1 minute, respectively.

The semiconductor device of the present invention has a cured product of a composition resulting from removing the (d) solvent from the semiconductor resin composition of the present invention, or a cured product of a semiconductor resin layer resulting from removing the support from the semiconductor resin film of the present invention.

The semiconductor device referred to herein refers to overall devices capable of functioning by use of characteristics of a semiconductor element, and includes all of electrooptic devices, semiconductor circuits and electronic devices.

An example of a production method of the semiconductor device of the present invention having a cured product of the composition resulting from removing the (d) solvent from the semiconductor resin composition of the present invention, or a cured product of the semiconductor resin layer of the present invention is as follows. The first circuit member having a first connection terminal and the second circuit member having a second connection terminal are placed so that the first connection terminal and the second connection terminal are opposed to each other. Next, a composition resulting from removing the (d) solvent from the semiconductor resin composition of the present invention, or a semiconductor resin layer resulting from removing the support from the semiconductor resin film of the present invention is interposed between the first connection terminal and the second connection terminal opposed to each other. Then, the first connection terminal and the second connection terminal opposed to each other are electrically connected to each other through the application of heat and pressure. In this time, the composition resulting from removing the (d) solvent from the semiconductor resin composition of the present invention or the semiconductor resin layer of the present invention becomes a cured product.

The electrically connecting may be performed after previously forming the composition resulting from removing the (d) solvent from the semiconductor resin composition or the semiconductor resin layer of the present invention on only a surface on a connection terminal side of either circuit member, or on both surfaces on connection terminal sides of the first and second circuit members. Further, a through electrode may be formed in one or both of the first circuit member and/or the second circuit member, and a connection terminal may be formed on one or both of the surfaces of the member. As such circuit members, chip components such as a semiconductor chip having bumps formed thereon, for example, plated bumps or stud bumps, a resistor chip and a capacitor chip; a semiconductor chip or a silicon interposer having TSV (through-silicon via) electrodes; and boards such as a glass epoxy circuit board and a film circuit board are used.

In addition to this, the semiconductor resin composition can be used as an adhesive resin material for preparing a die attach film, a dicing die attach film, a lead frame fixing tape, a heat dissipation plate, a reinforcing plate, an adhesive of a shielding material, a solder resist and the like.

A method will be described in which when a semiconductor chip having bumps, and a circuit board or semiconductor chip having a wiring pattern are electrically connected to each other, they are connected with the composition resulting from removing the (d) solvent from the semiconductor resin composition of the present invention or the semiconductor resin layer of the present invention interposed therebetween, and a gap between the semiconductor chip having bumps and the circuit board or semiconductor chip having a wiring pattern is sealed with the composition resulting from removing the (d) solvent from the semiconductor resin composition of the present invention or the semiconductor resin layer of the present invention to prepare a semiconductor device. The semiconductor chip having bumps, and the circuit board or semiconductor chip having a wiring pattern are connected to each other with the composition resulting from removing the (d) solvent from the semiconductor resin composition of the present invention or the semiconductor resin layer of the present invention interposed therebetween. In this case, the composition resulting from removing the (d) solvent from the semiconductor resin composition of the present invention, or the semiconductor resin layer of the present invention may be formed on any of a wiring-pattern surface of the circuit board having a wiring pattern and a bump-formed surface of the semiconductor chip having bumps. Further, a semiconductor chip having a layer of the composition resulting from removing the (d) solvent from the semiconductor resin composition of the present invention or the semiconductor resin layer of the present invention bonded thereto may be prepared by forming a layer of the composition resulting from removing the (d) solvent from the semiconductor resin composition of the present invention or the semiconductor resin layer of the present invention on a bump-formed surface of a semiconductor wafer, and then singulating the semiconductor wafer by dicing.

Examples of a method of forming a layer made of the composition resulting from removing the (d) solvent from the semiconductor resin composition of the present invention include a method in which the semiconductor resin composition is directly applied onto a semiconductor chip, a circuit board or a semiconductor wafer, and then dried, and a method in which the semiconductor resin film of the present invention is bonded to a semiconductor chip, a circuit board or a semiconductor wafer, and then a support is removed. For drying, an oven, a hot plate, infrared rays or the like may be used. The drying temperature and the drying time need only to be in a range where the solvent can be volatilized and it is preferred to appropriately set such a range in which the composition resulting from removing the (d) solvent from the semiconductor resin composition of the present invention or the semiconductor resin layer of the present invention is in a state of being uncured or semicured. Specifically, drying is preferably carried out in the range of 40 to 120° C. for 1 minute to several tens of minutes. Further, drying (heat treatment) may be carried out at various temperatures increasing in phases, for example, at 50° C., at 60° C., and then at 70° C. for 1 minute, respectively. Further, a step of exposing bumps by a mechanical method may be added before performing mounting with a bonding device after forming the composition resulting from removing the (d) solvent from the semiconductor resin composition of the present invention or the semiconductor resin layer of the present invention. That is, a method described in (2012 IEEE 62th ELECTRONIC COMPONENTS AND TECHNOLOGY CONFERENCE (ECTC), p 444-449, 2012) or the like can be used.

After the composition resulting from removing the (d) solvent from the semiconductor resin composition of the present invention or the semiconductor resin layer of the present invention is formed on a circuit board provided with a wiring pattern or a semiconductor chip, mounting can be performed by a bonding device. Mounting conditions are not particularly limited as long as good electrical connection can be achieved, but application of heat and pressure needs to be performed at a temperature of 100° C. or higher and at a pressure of 1 mN/bump or larger for 0.1 second or longer in order to cure the composition resulting from removing the (d) solvent from the semiconductor resin composition of the present invention or the semiconductor resin layer of the present invention. With respect to bonding conditions, the bonding temperature is preferably 120° C. to 300° C., more preferably 150° C. to 250° C., the bonding pressure is preferably 5 mN/bump to 50000 mN/bump, more preferably 10 mN/bump to 10000 mN/bump, and the bonding time is preferably 1 second to 60 seconds, more preferably 2 seconds to 30 seconds. In the bonding, temporary press-bonding is performed by contacting bumps on the semiconductor chip with a wiring pattern on the circuit board through the application of heat and pressure at a temperature of 50° C. or higher and a pressure of 1 mN/bump or more for 0.1 second or longer, and then the bonding is performed under the above conditions. After the bonding is performed, as required, the circuit board provided with the semiconductor chip may be heated at a temperature of 50° C. to 200° C. for 10 seconds to 24 hours.

EXAMPLES

The present invention will be described below with reference to examples, but these examples are not intended to limit the present invention. Evaluations of the semiconductor resin composition in Examples were performed by the methods described below.

(1) Evaluation of Uniformity in Film Thickness Direction of Semiconductor Resin Composition Semiconductor resin compositions 1 to 9 obtained in Examples 1 to 9, and comparison resin compositions 1 to 4 obtained in Comparative Examples 1 to 4 were applied onto a silicon wafer of 4 inches with an applicator and dried for 10 minutes on a hot plate at 100° C. to form a semiconductor resin layer having a film thickness of about 40 μm on the silicon wafer. Part of the wafer having the semiconductor resin layer formed thereon was embedded in an epoxy resin and polished, and thereby an evaluation sample was prepared. A mixture composed of Claro Cit Powder and Claro Cit Liquid (manufactured by Struers ApS) in proportions of 5:3 was used for a resin for embedding. Part of the wafer provided with a coating was put in the mixture and left at rest for about 1 hour to cure a resin. The resin-embedded wafer was polished so that its cross section was exposed to prepare an evaluation sample. TegraPol-21 manufactured by Struers ApS was used for a polishing device. DP-Nap was used for a polishing paper, DP-Suspension P (1 μm) was used for a polishing agent, and DP-Lubricant was used for a lubricant. The obtained evaluation sample was observed with a scanning electron microscope (SEM, JSM-6510A manufactured by JEOL Ltd.). In the resulting SEM image, comparing a ratio of a cross-section area of the inorganic particles in an area of a portion surrounded by a square in which one side is adjacent to a wafer plane and an each side length is one-tenth of a film thickness with a ratio of a cross-section area of the inorganic particles in an area of a portion surrounded by a square in which one side is adjacent to a film upper plane opposite to the wafer and an each side length is one-tenth of a film thickness, the case where the disparity between these ratios is below 5 times can be determined that distribution of the inorganic particles is uniform, and the case where the disparity between these ratios is larger than 5 times can be determined that distribution of the inorganic particles is nonuniform.

Figure 1:
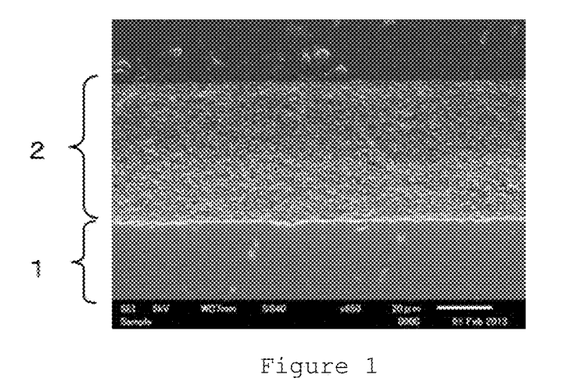
FIG. 1 shows an example of a SEM image of a semiconductor resin layer in which inorganic particles are uniformly distributed up to a film upper portion.

In the present observing method, in the SEM image, an arbitrary measurement location can be set in parallel with a wafer, that is, in a horizontal direction of a photograph of FIG. 1, the above observation is performed at both ends and a center of the SEM image, that is, at left and right ends and a center of a photograph of FIG. 1, and the case where the distribution of the inorganic particles can be determined to be uniform at all of the left end, the right end and the center, was rated as good, and the case different from this was rated as defective.

Figure 2:
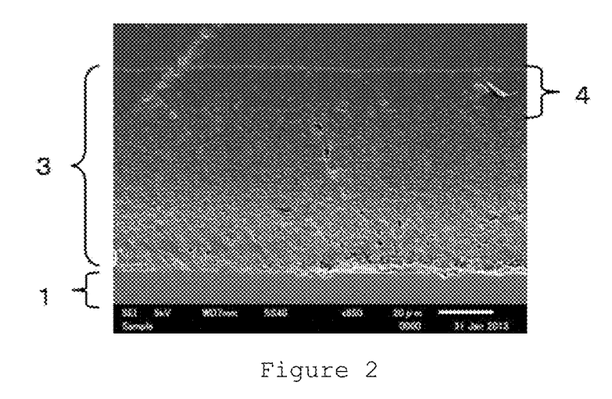
FIG. 2 shows an example of a SEM image of a semiconductor resin layer in which there is a region lacking inorganic particles in a film upper portion.

FIG. 1 is an example of a SEM image of a semiconductor resin layer in which inorganic particles are uniformly distributed up to a film upper portion, and FIG. 2 is an example of a SEM image of a semiconductor resin layer in which there is a region lacking inorganic particles in a film upper portion.

(2) Evaluation on Preparation of Semiconductor Resin Film

Each of the semiconductor resin compositions 1 to 9 obtained in Examples 1 to 9, and the comparison resin compositions 1 to 4 obtained in Comparison Examples 1 to 4 were applied onto a polyimide film (trade name; Kapton 150EN-C) having a thickness of 37.5 μm as an exfoliative substrate so that a dried thickness is 25 μm using a slit die coater (coating machine), and dried at 80° C. for 10 minutes. An untreated side of a polypropylene film (trade name; Torayfan BO type YK57, one side treated through corona discharge) having a thickness of 8 μm as a surface protection exfoliative substrate was laminated on the resulting semiconductor resin film at a heating roll temperature of 35° C., and the laminate was wound up around a paper tube with an outer diameter of 9.6 cm in the form of a roll so that the exfoliative substrate is inside to obtain a master roll having the exfoliative substrates on both sides of the semiconductor resin film (three-layer structure of an exfoliative substrate, a semiconductor resin film and a surface protection exfoliative substrate).

The resulting master rolls were observed with a microscope, and cracks of the semiconductor resin film and the presence or absence of exfoliation from a polypropylene film, an exfoliative substrate, were evaluated. The master roll in which cracks of the semiconductor resin film or exfoliations were not found was rated as good, and the master roll in which cracks or exfoliations were found was rated as bad.

(3) Evaluation of Coefficient of Linear Expansion of Semiconductor Resin Composition The master roll obtained in the above evaluation was cut into pieces having a size of 8 cm square, and this piece was laminated repeatedly until a thickness reached 2 mm using a vacuum laminator MVLP-500/600 (manufactured by Meiki Co., Ltd.). With respect to laminating conditions, temperatures of an upper heat plate and a lower heat plate were set to 90° C., a vacuum time was set to 20 seconds, an applied pressure was set to 0.3 MPa, and a pressure time was set to 30 seconds. The resulting laminated product was subjected to a heat treatment at 200° C. for 15 minutes. The heat treated laminated product was cut using a dicing device DAD 3350 (manufactured by DISCO Corporation) to prepare a rectangular parallelepiped of 2 mm wide, 15 mm long and 2.5 mm high. The coefficient of linear expansion of the rectangular parallelepiped was evaluated using a heat/stress/strain measurement device (TMA/SS6100, manufactured by SII Nanotechnology Corporation). Measurement was carried out at a temperature raising rate of 10° C./min in a temperature range of −50 to 300° C. The coefficient of linear expansion was calculated in a temperature range below a glass transition temperature (Tg).

Further, synthesis of the (c) polyimide used in Examples and Comparative Examples was performed by the following method.

Synthesis Example 1 Synthesis of (c) Polyimide

Under a stream of dry nitrogen, 4.82 g (0.0165 mol) of 1,3-bis(3-aminophenoxy) benzene (hereinafter referred to as APB-N), 3.08 g (0.011 mol) of 3,3'-diamino-4,4'-dihydroxydiphenyl sulfone (hereinafter referred to as ABPS), 4.97 g (0.02 mol) of bis(3-aminopropyl) tetramethyldisiloxane (hereinafter referred to as SiDA), and 0.47 g (0.005 mol) of aniline as an end-capping agent were dissolved in 130 g of NMP. To the resulting solution, 26.02 g (0.05 mol) of 2,2-bis{4-(3,4-dicarboxyphenoxy)phenyl}propane dianhydride (hereinafter referred to as BSAA) was added together with 20 g of NMP and reacted at 25° C. for 1 hour, and then the solution was stirred at 50° C. for 4 hours. Thereafter, the solution was stirred at 180° C. for 5 hours. After completion of the stirring, the solution was introduced into 3 L of water and filtered to collect a precipitate, and the precipitate was washed with water three times and dried at 80° C. for 20 hours using a vacuum drier. The resulting polymer solid was subjected to infrared absorption spectrum measurement, and consequently absorption peaks of an imide structure attributed to polyimide were detected around 1780 cm$^{-1}$ and around 1377 cm$^{-1}$. In this manner, a polyimide A which had a functional group reactive with an epoxy group and included the structure represented by the general formula (1) in an amount of 11.6 wt % with respect to the total amount of polyimide was obtained. When 6 g of tetrahydrofuran was added to 4 g of the polyimide A and stirred at 23° C., the polyimide A was dissolved in tetrahydrofuran. That is, the polyimide A was organic solvent-soluble.

Other components used in Examples and Comparative Examples are as described below. In addition, the epoxy resin contained in the rubber particle is considered as a part of the (a) epoxy compound.

(a) Epoxy Compound
Solid epoxy compound: NC3000-H (manufactured by Nippon Kayaku Co., Ltd.)
Liquid epoxy compound: YL980 (manufactured by Mitsubishi Chemical Corporation)

(b) Inorganic Particle
SE2050 (silica particles manufactured by Admatechs Co., Ltd., average particle diameter: 0.5 μm)
SE5100 (silica particles manufactured by Admatechs Co., Ltd., average particle size: 1.5 μm)
YA100C-SP3 (silica particles manufactured by Admatechs Co., Ltd., average particle size: 0.1 μm)
FB-5LDX (silica particles manufactured by Denka Co., Ltd., average particle size: 4.2 μm)

(d) Solvent
PGMEA (manufactured by KH Neochem Co., Ltd.)
Ethyldiglycol (manufactured by Daicel Corporation)

(e) Rubber Particle
Kane Ace MX 113 (manufactured by Kaneka Corporation, liquid epoxy resin containing 30% by weight of core-shell rubber particles (liquid epoxy resin: 70% by weight), average particle diameter of core-shell rubber particle: 0.1 μm)

(f) Epoxy Curing Agent
2PZ (manufactured by SHIKOKU CHEMICALS CORPORATION)

Example 1

NC3000-H (manufactured by Nippon Kayaku Co., Ltd.) (11.35 g), SE2050 (silica particles manufactured by Admatechs Co., Ltd., average particle diameter: 0.5 μm) (54.60 g), Kane Ace MX 113 (manufactured by Kaneka Corporation, epoxy resin containing 30% by weight of core-shell rubber particles) (4.68 g), the polyimide A obtained in Synthesis Example 1 (6.90 g) and PGMEA (manufactured by KH Neochem Co., Ltd.) (22.00 g) were added to a 250 ml polyethylene container, and the resulting mixture was stirred at room temperature for 96 hours on a ball mill stand. Thereafter, 0.47 g of 2PZ (manufactured by SHIKOKU CHEMICALS CORPORATION) was added, and the resulting mixture was further stirred for 24 hours. Using a filter with a retained particle diameter of 10 µm, the resulting mixed liquid was subjected to pressurized filtration to obtain a semiconductor resin composition 1. A weight ratio of SE2050 in the weight of the total solid fraction (weight of a sum of polyimide A, Kane Ace MX 113, NC3000-H, SE2050 and 2PZ) was 70 wt %.

Example 2

A semiconductor resin composition 2 was obtained in the same manner as in Example 1 except for using 2.34 g of Kane Ace MX 113 and 2.34 g of YL980 instead of using 4.68 g of Kane Ace MX 113.

Example 3

A semiconductor resin composition 3 was obtained in the same manner as in Example 1 except for using 1.17 g of Kane Ace MX 113 and 3.51 g of YL980 instead of using 4.68 g of Kane Ace MX 113.

Example 4

A semiconductor resin composition 4 was obtained in the same manner as in Example 1 except for using ethyldiglycol (manufactured by Daicel Corporation) alone in place of PGMEA.

Example 5

A semiconductor resin composition 5 was obtained in the same manner as in Example 1 except for using SE5100 (silica particles manufactured by Admatechs Co., Ltd., average particle size: 1.5 µm) alone in place of SE2050.

Example 6

A semiconductor resin composition 6 was obtained in the same manner as in Example 1 except for using YA100C-SP3 (silica particles manufactured by Admatechs Co., Ltd., average particle size: 0.1 µm) alone in place of SE2050.

Example 7

A semiconductor resin composition 7 was obtained in the same manner as in Example 1 except for using FB-5LDX (silica particles manufactured by Denka Co., Ltd., average particle size: 4.2 µm) alone in place of SE2050.

Example 8

A semiconductor resin composition 8 was obtained in the same manner as in Example 1 except that compounded amounts of the respective components are changed to values shown in Table 2 so that a ratio of SE2050 in the weight of the total solid fraction is 60 wt %.

Example 9

A semiconductor resin composition 9 was obtained in the same manner as in Example 1 except that compounded amounts of the respective components are changed to values shown in Table 2 so that a ratio of SE2050 in the weight of the total solid fraction is 90 wt %.

Comparative Example 1

A comparison resin composition 1 was obtained in the same manner as in Example 1 except for using YL980 alone in place of Kane Ace MX 113.

Comparative Example 2

A comparison resin composition 2 was obtained in the same manner as in Example 1 except for using YL980 alone in place of Kane Ace MX 113 and using ethyldiglycol alone in place of PGMEA.

Comparative Example 3

A comparison resin composition 3 was obtained in the same manner as in Example 1 except that compounded amounts of the respective components are changed to values shown in Table 2 so that a ratio of SE2050 in the weight of the total solid fraction is 50 wt %.

Comparative Example 4

A comparison resin composition 4 was obtained in the same manner as in Example 1 except that compounded amounts of the respective components are changed to values shown in Table 2 so that a ratio of SE2050 in the weight of the total solid fraction is 95 wt %.

Evaluation results of Examples and Comparative Examples are shown in Tables 1 and 2. In addition, in the comparison resin composition 4 and the comparison resin composition 5, cracks or exfoliations were found in the semiconductor resin film. Since severe cracks were further produced in cutting the film, a sample for evaluation of the coefficient of linear expansion could not be prepared. Therefore, the coefficient of linear expansion of the comparison resin composition 4 could not be evaluated.

TABLE 1

| | | | | Example 1 | Example 2 | Example 3 | Example 4 | Example 5 | Example 6 | Example 7 |
|---|---|---|---|---|---|---|---|---|---|---|
| Composition (part(s) by weight) | (a) Epoxy compound | Solid | NC3000-H | 11.35 | 11.35 | 11.35 | 11.35 | 11.35 | 11.35 | 11.35 |
| | | Liquid | YL980 | 0 | 2.34 | 3.51 | 0 | 0 | 0 | 0 |
| | | (e) Derived from rubber particle | | 3.28 | 1.64 | 0.82 | 3.28 | 3.28 | 3.28 | 3.28 |

TABLE 1-continued

|  |  |  | Example 1 | Example 2 | Example 3 | Example 4 | Example 5 | Example 6 | Example 7 |
|---|---|---|---|---|---|---|---|---|---|
| (b) Inorganic particle | | SE2050 (average 0.5 μm) | 54.60 | 54.60 | 54.60 | 54.60 | 0 | 0 | 0 |
| | | SE5100 (average 1.5 μm) | 0 | 0 | 0 | 0 | 54.60 | 0 | 0 |
| | | YA100C-SP3 (average 0.1 μm) | 0 | 0 | 0 | 0 | 0 | 54.60 | 0 |
| | | FB-5LDX (average 4.2 μm) | 0 | 0 | 0 | 0 | 0 | 0 | 54.60 |
| (c) Polyimide | | Polyimide A | 6.90 | 6.90 | 6.90 | 6.90 | 6.90 | 6.90 | 6.90 |
| (d) Solvent | | PGMEA | 22.00 | 22.00 | 22.00 | 0 | 22.00 | 22.00 | 22.00 |
| | | Ethyldiglycol | 0 | 0 | 0 | 22.00 | 0 | 0 | 0 |
| (e) Rubber particle | | Kane Ace MX 113 (average 0.1 μm) | 4.68 | 2.34 | 1.17 | 4.68 | 4.68 | 4.68 | 4.68 |
| | | Rubber particle net fraction (30 wt %) | 1.40 | 0.70 | 0.35 | 1.40 | 1.40 | 1.40 | 1.40 |
| (f) Epoxy curing agent | | 2PZ | 0.47 | 0.47 | 0.47 | 0.47 | 0.47 | 0.47 | 0.47 |
| Ratio of inorganic particles in weight of total solid fraction (wt %) | | | 70 | 70 | 70 | 70 | 70 | 70 | 70 |
| Weight of (c) rubber particles at the time of taking weight of liquid epoxy compound as 100 | | | 42.9 | 17.6 | 8.1 | 42.9 | 42.9 | 42.9 | 42.9 |
| Ratio of liquid epoxy compound in total epoxy compounds | | | 22.4 | 26.0 | 27.6 | 22.4 | 22.4 | 22.4 | 22.4 |
| Evaluation | (1) Evaluation of uniformity in film thickness direction | | good | good | good | good | good | good | good |
| | (2) Evaluation on preparation of semiconductor resin film | | good | good | good | good | good | good | good |
| | (3) Coefficient of linear expansion (ppm/° C.) * Tg or lower | | 23 | 22 | 22 | 23 | 21 | 24 | 21 |

TABLE 2

|  |  |  |  | Example 8 | Example 9 | Comparative Example 1 | Comparative Example 2 | Comparative Example 3 | Comparative Example 4 |
|---|---|---|---|---|---|---|---|---|---|
| Composition (part(s) by weight) | (a) Epoxy compound | Solid | NC3000-H | 15.13 | 3.78 | 11.35 | 11.35 | 18.92 | 1.89 |
| | | Liquid | YL980 | 0 | 0 | 4.68 | 4.68 | 0 | 0 |
| | | | (e) Derived from rubber particle | 4.37 | 1.09 | 0 | 0 | 5.46 | 0.55 |
| | (b) Inorganic particle | | SE2050 (average 0.5 μm) | 46.80 | 70.20 | 54.60 | 54.60 | 39.00 | 74.10 |
| | | | SE5100 (average 1.5 μm) | 0 | 0 | 0 | 0 | 0 | 0 |
| | | | YA100C-SP3 (average 0.1 μm) | 0 | 0 | 0 | 0 | 0 | 0 |
| | | | FB-5LDX (average 4.2 μm) | 0 | 0 | 0 | 0 | 0 | 0 |
| | (c) Polyimide | | Polyimide A | 9.20 | 2.30 | 6.90 | 6.90 | 11.51 | 1.15 |
| | (d) Solvent | | PGMEA | 22.00 | 22.00 | 22.00 | 0 | 22.00 | 22.00 |
| | | | Ethyldiglycol | 0 | 0 | 0 | 22.00 | 0 | 0 |
| | (e) Rubber particle | | Kane Ace MX 113 (average 0.1 μm) | 6.24 | 1.56 | 0 | 0 | 7.80 | 0.78 |
| | | | Rubber particle net fraction (30 wt %) | 1.87 | 0.47 | 0 | 0 | 2.34 | 0.23 |
| | (f) Epoxy curing agent | | 2PZ | 0.62 | 0.16 | 0.47 | 0.47 | 0.78 | 0.08 |
| Ratio of inorganic particles in weight of total solid fraction (wt %) | | | | 60 | 90 | 70 | 70 | 50 | 95 |
| Weight of (c) rubber particles at the time of taking weight of liquid epoxy compound as 100 | | | | 42.9 | 42.9 | 0 | 0 | 42.9 | 42.9 |
| Ratio of liquid epoxy compound in total epoxy compounds | | | | 22.4 | 22.4 | 29.2 | 29.2 | 22.4 | 22.5 |
| Evaluation | (1) Evaluation of uniformity in film thickness direction | | | good | good | bad | bad | good | good |
| | (2) Evaluation on preparation of semiconductor resin film | | | good | good | good | good | good | bad |
| | (3) Coefficient of linear expansion (ppm/° C.) * Tg or lower | | | 28 | 17 | 22 | 24 | 38 | — |

DESCRIPTION OF REFERENCE SIGNS

1 Wafer
2 Semiconductor resin layer
3 Resin layer for comparison
4 Region lacking inorganic particles

The invention claimed is:
1. A semiconductor resin composition which contains:
(a) an epoxy compound,
(b) inorganic particles,
(c) a polyimide,
(d) a solvent, and
(e) rubber particles,
wherein a ratio of the (b) inorganic particles based on the weight of the total solid fraction resulting from subtracting the weight of the (d) solvent from the total weight of the semiconductor resin composition is 60 wt % or more and 92 wt % or less,
wherein the (c) polyimide has a structure represented by a general formula (2) or a general formula (3), has at least one functional group reactive with an epoxy group on its side chain, has a structure represented by a general formula (1) as $R^4$ in the general formula (2) or the general formula (3), and the amount of the structure represented by the general formula (1) is 5 wt % or more and 15 wt % or less with respect to the total amount of the (c) polyimide:

(1)

in which $R^1$ is a divalent hydrocarbon group, $R^2$ is a monovalent hydrocarbon group, and n represents an integer of 1 to 2;

(2)

(3)

in which
$R^3$ is a tetra- to 14-valent organic group,
$R^4$ is a di- to 12-valent organic group,
at least one of $R^3$ and $R^4$ contains at least one group selected from the group consisting of a 1,1,1,3,3,3-hexafluoropropyl group, an isopropyl group, an ether group, a thioether group and a $SO_2$ group,
$R^5$ and $R^6$ each represent a phenolic hydroxyl group, a sulfonic acid group or a thiol group, X represents a monovalent organic group,
m is 8 to 200,
α and β each represent an integer of 0 to 10, α+β is an integer of 1 to 10, and a ratio of the structural units in which α+β is an integer of 1 to 10 in the structural units whose repeating number is m, is 20 to 90 mol %, and
wherein the number average particle diameter of the (e) rubber particles is smaller than or equal to the number average particle diameter of the (b) inorganic particles.

2. The semiconductor resin composition according to claim 1, wherein the (c) polyimide is organic solvent-soluble.

3. The semiconductor resin composition according to claim 1, wherein the number average particle diameter of the (b) inorganic particles is 10 nm or more and 5 μm or less.

4. The semiconductor resin composition according to claim 1, wherein the (a) epoxy compound contains a liquid epoxy compound and a solid epoxy compound, and a weight ratio of the liquid epoxy compound in the (a) epoxy compound is 10 to 50 wt %.

5. The semiconductor resin composition according to claim 4, wherein the amount of the (e) rubber particles is 2 to 100 parts by weight with respect to 100 parts by weight of the liquid epoxy compound.

6. The semiconductor resin composition according to claim 1, wherein the (e) rubber particle is a core-shell rubber particle.

7. A semiconductor resin film having, on a support, a semiconductor resin layer containing:
(a) an epoxy compound,
(b) inorganic particles,
(c) a polyimide, and
(e) rubber particles,
wherein a ratio of the (b) inorganic particles based on the weight of the semiconductor resin layer is 60 wt % or more and 92 wt % or less,
wherein the (c) polyimide has a structure represented by a general formula (2) or a general formula (3), has at least one functional group reactive with an epoxy group on its side chain, has a structure represented by a general formula (1) as $R^4$ in the general formula (2) or the general formula (3), and the amount of the structure represented by the general formula (1) is 5 wt % or more and 15 wt % or less with respect to the total amount of the (c) polyimide:

(1)

in which $R^1$ is a divalent hydrocarbon group, $R^2$ is a monovalent hydrocarbon group, and
n represents an integer of 1 to 2;

(2)

-continued (3)

in which
R³ is a tetra- to 14-valent organic group,
R⁴ is a di- to 12-valent organic group,
at least one of R³ and R⁴ contains at least one group selected from the group consisting of a 1,1,1,3,3,3-hexafluoropropyl group, an isopropyl group, an ether group, a thioether group and a $SO_2$ group,
R⁵ and R⁶ each represent an organic group having at least one group selected from the group consisting of a phenolic hydroxyl group, a sulfonic acid group and a thiol group,
X represents a monovalent organic group,
m is 8 to 200,
α and β each represent an integer of 0 to 10, α+β is an integer of 1 to 10, and a ratio of the structural units in which α+β is an integer of 1 to 10 in the structural units whose repeating number is m, is 20 to 90 mol %, and wherein the number average particle diameter of the (e) rubber particles is smaller than or equal to the number average particle diameter of the (b) inorganic particles.

8. The semiconductor resin film according to claim 7, wherein the (c) polyimide is organic solvent-soluble.

9. The semiconductor resin film according to claim 7, wherein the number average particle diameter of the (b) inorganic particles is 10 nm or more and 5 μm or less.

10. The semiconductor resin film according to claim 7, wherein the (a) epoxy compound contains a liquid epoxy compound and a solid epoxy compound, and a weight ratio of the liquid epoxy compound in the (a) epoxy compound is 10 to 50 wt %.

11. The semiconductor resin film according to claim 10, wherein the amount of the (e) rubber particles is 2 to 100 parts by weight with respect to 100 parts by weight of the liquid epoxy compound.

12. The semiconductor resin film according to claim 7, wherein the (e) rubber particle is a core-shell rubber particle.

13. A semiconductor device having a cured product of the composition resulting from removing the (d) solvent from the semiconductor resin composition according to claim 1.

14. A semiconductor device having a cured product of the semiconductor resin film according to claim 7.

* * * * *